United States Patent
Ou

(10) Patent No.: US 8,933,619 B1
(45) Date of Patent: Jan. 13, 2015

(54) KIND OF LAMP HOLDER STRUCTURE OF LED BULB

(71) Applicant: Dongguan Huigang Computer Technology Co., Ltd., Guangdong Province (CN)

(72) Inventor: Nanjie Ou, Hunan Province (CN)

(73) Assignee: Dongguan Qijia Electronics Co., Ltd., Guangdong Province (CN)

(*) Notice: Subject to any disclaimer, the term of this patent is extended or adjusted under 35 U.S.C. 154(b) by 0 days.

(21) Appl. No.: 14/079,644

(22) Filed: Nov. 14, 2013

(30) Foreign Application Priority Data

Sep. 23, 2013 (CN) .......................... 2013 2 0586209

(51) Int. Cl.
| F21V 21/00 | (2006.01) |
| F21V 23/00 | (2006.01) |
| F21V 19/00 | (2006.01) |
| F21K 99/00 | (2010.01) |
| F21Y 101/02 | (2006.01) |
| F21Y 111/00 | (2006.01) |

(52) U.S. Cl.
CPC .............. *F21K 9/135* (2013.01); *F21V 23/005* (2013.01); *F21Y 2101/02* (2013.01); *F21Y 2111/008* (2013.01); *H05K 2201/10106* (2013.01)
USPC ................. 313/317; 313/318.01; 362/311.02; 362/249.02; 362/249.01

(58) Field of Classification Search
CPC ..... F21V 23/003–23/009; F21K 9/10–9/1355; H05K 2201/10106–2201/10113; F21Y 2101/003; F21Y 2101/02; F21Y 2111/008
USPC .............................. 313/43–47, 317–318.12; 362/311.01–311.15, 249.01–249.02
See application file for complete search history.

(56) References Cited

U.S. PATENT DOCUMENTS

| 2003/0031015 A1* | 2/2003 | Ishibashi | 362/249 |
| 2010/0270904 A1* | 10/2010 | Kim | 313/46 |
| 2011/0248631 A1* | 10/2011 | Chuang | 315/32 |
| 2013/0294082 A1* | 11/2013 | Matsuda et al. | 362/293 |

* cited by examiner

*Primary Examiner* — Mariceli Santiago
(74) *Attorney, Agent, or Firm* — Prakash Nama; Global IP Services, PLLC

(57) ABSTRACT

The utility model discloses a kind of lamp holder structure of LED bulb comprising a transparent stem, an upper PCB board with upper mounting hole and a lower PCB board with lower mounting hole while the transparent stem is nested to the upper mounting hole and the lower mounting hole in sequence, a LED tube installed between the upper PCB board and the lower PCB board as well as separately electrically-connected to them. The LED tube can be secured by soldering to the appropriate welding position on the upper and lower PCB board. The transparent stem is equivalent to a fixed support for the upper and lower PCB board. When illuminated, the LED tube lights up and all give out light at 360 degree. The structure design makes the higher luminous flux and efficiency for the utility model. Thereby, the utility model is advanced in higher luminous flux, high efficiency and novel structure design.

2 Claims, 1 Drawing Sheet

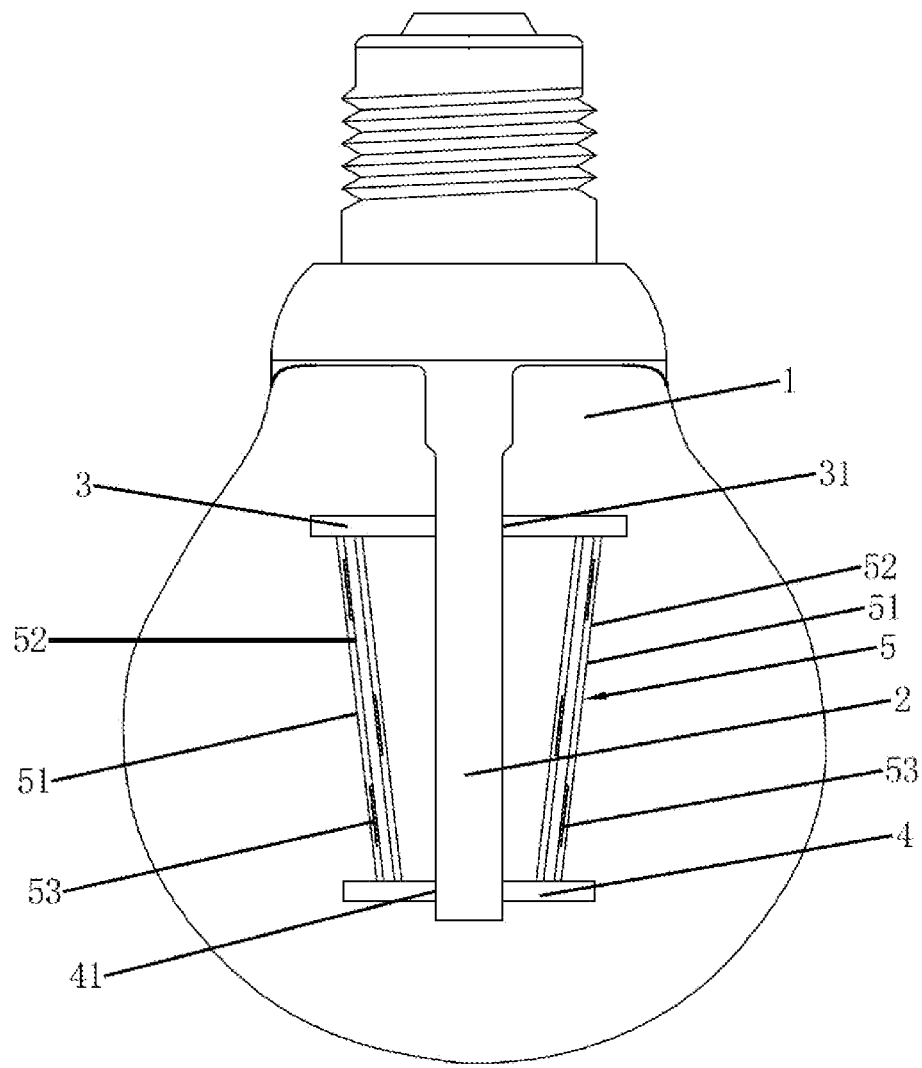

KIND OF LAMP HOLDER STRUCTURE OF LED BULB

BACKGROUND OF THE INVENTION

The utility model relates to technical field of LED lighting fixture, especially a kind of lamp holder structure of LED bulb.

At present, LED luminaire which has gradually replaced the traditional lamp since it can reduce the manufacture cost at a large scale and has characters of long life, and low power consumption became a highly developed new lighting source in the industry to meet energy saving and environment protection requirements.

As a significant type of LED luminaire structure, LED bulb is widely used in daily life. However, the common defect of lower luminous flux of current LED bulb has limited the further promotion of LED lamp.

BRIEF SUMMARY OF THE INVENTION

The utility model aims to provide a kind of lamp holder structure of LED bulb to cover the shortage of current technology. It is able to achieve properties of higher luminous flux, lighting efficiency and novel design.

In order to reach the above goals, the utility model applies the following technical solutions:

A kind of lamp holder structure of LED bulb, comprising a transparent stem set at the core position of transparent bulb and integrated with a transparent bulb; an upper PCB board and a lower PCB board inside the transparent bulb paralleling to each other and being placed at a distance with the lower PCB below the upper PCB, an upper thorough mounting hole opened at the core position of upper PCB board corresponding to the transparent stem and a lower thorough mounting hole of the lower PCB board while the transparent stem is nested to the upper mounting hole and the lower mounting hole in sequence; a LED tube provided between the upper PCB board and the lower PCB board being separately electrically-connected to the them.

Thereinto, the LED tube LED tube contains a tube bulb, a transparent core tube built in the tube bulb and the LED light-bar equipped on the surface of transparent core tube.

Beneficial effects of the utility model: the utility model is a kind of lamp holder structure of LED bulb comprising a transparent stem, an upper PCB board with upper mounting hole and a lower PCB board with lower mounting hole while the transparent stem is nested to the upper mounting hole and the lower mounting hole in sequence, a LED tube installed between the upper PCB board and the lower PCB board as well as separately electrically-connected to them. The LED tube can be secured by soldering to the appropriate welding position on the upper and lower PCB board. The transparent stem is equivalent to a fixing support for the upper and lower PCB board. When illuminated, the LED tube light up and all give out light at 360 degree. The structure design enables the utility model with higher luminous flux and efficiency. With the above cases, the utility model is advanced in higher luminous flux, high efficiency and novel structure design.

BRIEF DESCRIPTION OF THE DRAWINGS

The utility model will be further described in detail with the help of attached drawings. But the specific embodiment in the attached drawings shall not be construed as a restriction on the utility model.

FIG. 1 is the structure diagram of the utility model.

FIG. 1 contains:

| 1 | Transparent bulb | 2 | Transparent stem |
|---|---|---|---|
| 3 | Upper PCB board | 31 | Upper mounting hole |
| 4 | Lower PCB board | 41 | Lower mounting hole |
| 5 | LED tube | 51 | Tube bulb |
| 52 | Transparent core tube | 53 | LED light bar |

DETAILED DESCRIPTION OF THE INVENTION

The utility model will be further described with the help of detailed implementation methods.

As shown in FIG. 1, a kind of lamp holder structure of LED bulb contains a transparent stem 2 set at the core position of transparent bulb 1 and integrated with a transparent bulb 1; an upper PCB board 3 and a lower PCB board 4 inside the transparent bulb 1 paralleling to each other and being placed at a distance with the lower PCB 4 below the upper PCB 3, an upper thorough mounting hole 31 opened at the core position of upper PCB board 3 corresponding to the transparent stem 2 and a lower thorough mounting hole 41 of the lower PCB board 4 while the transparent stem 2 is nested to the upper mounting hole 31 and the lower mounting hole 41 in sequence; a LED tube 5 provided between the upper PCB board 3 and the lower PCB board 4 being separately electrically-connected to the them.

Furthermore, the LED tube 5 comprises a tube bulb 51, a transparent core tube 52 built in the tube bulb 51 and the LED light-bar 53 equipped on the surface of transparent core tube 52.

The upper and lower terminals of LED tube 5 are secured by soldering to the corresponding welding positions on the upper and lower PCB board. For further explanation, one LED tube 5, or two or more LED tubes could be installed between the upper PCB board 3 and the lower PCB board 4. Thereinto, for lamp holder structure with two or more LED tubes 5, each LED tube 5 shall be connected in series.

In the course of actual use, the transparent bulb 1 head can be equipped with a screw lamp cap or bayonet cap. The cap models could be: E12, E14, E17, E26, E27, G8, G9, B15, B22 and etc.

The transparent stem 2 of the utility model is equivalent to a fixing support to secure the upper PCB board 3 and the lower PCB board 4. For further explanation, two or more Led tubes 5 can be applied for the utility model. In the course of actual use, each LED tube 5 lights up simultaneously and all tubes give out light at 360 degree as a whole. The structure design enables the higher luminous flux and efficiency for the utility model.

According to the above cases, the utility model is advanced in higher luminous flux, efficiency and novel structure design.

For further explanation, the utility model secures the LED tube 5 by the upper PCB board 3 and the lower PCB board 4. Thereinto, the utility model could apply two hardware supports to replace the upper 3 and lower PCB board 4, that is, the utility model could apply a transparent stem 2 and two hardware supports to secure LED tube 5.

Besides, for LED bulb applying the above lamp holder structure, shall evacuate the transparent bulb 1 and break vacuum with inert gases. Thereinto, inert gas increases the heat dissipation rate and improves thermal performance in result of extending the service life.

The foregoing embodiments are merely preferred embodiment of the utility model, and it should be noted that ordinary technical staff in the filed are allowed to make some changes and improvements to some extend on specific implementation methods and application range according to concepts of the utility model. The content of this instruction shall not be interpreted as a restriction to the utility model.

What is claimed is:

1. A kind of lamp holder structure of LED bulb that it contains a transparent stem (2) set at the core position of transparent bulb (1) and integrated with a transparent bulb (1); an upper PCB board (3) and a lower PCB board (4) both inside the transparent bulb (1) paralleling to each other and being placed at a distance with the lower PCB below the upper PCB, an upper thorough mounting hole (31) opened at the core position of the upper PCB board (3) corresponding to the transparent stem (2) and a lower thorough mounting hole (41) of the lower PCB board (4) while the transparent stem is nested to the upper mounting hole (31) and the lower mounting hole (41) in sequence; a LED tube (5) provided between the upper PCB board (3) and the lower PCB board (4) and being separately electrically-connected to the them.

2. A kind of lamp holder structure of LED bulb as claimed in claim 1 features that the LED tube (5) contains a tube bulb (51), a transparent core tube (52) built in the tube bulb (51) and the LED light-bar (53) equipped on the surface of transparent core tube (52).

* * * * *